(12) United States Patent
Ryu et al.

(10) Patent No.: US 11,900,713 B2
(45) Date of Patent: Feb. 13, 2024

(54) DISPLAY DEVICE

(71) Applicant: SAMSUNG DISPLAY CO., LTD., Yongin-si (KR)

(72) Inventors: Ji-Hun Ryu, Hwaseong-si (KR); Kwanghyun Baek, Asan-si (KR); Jongin Baek, Hwaseong-si (KR); Suyul Seo, Incheon (KR); Jaehyung Jo, Asan-si (KR); Sungho Jin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/344,195

(22) Filed: Jun. 10, 2021

(65) Prior Publication Data
US 2022/0067328 A1  Mar. 3, 2022

(30) Foreign Application Priority Data

Aug. 26, 2020  (KR) .................... 10-2020-0107996

(51) Int. Cl.
*H01L 27/32* (2006.01)
*G06V 40/13* (2022.01)
(Continued)

(52) U.S. Cl.
CPC ........ *G06V 40/1318* (2022.01); *G06V 10/147* (2022.01); *G06V 40/1329* (2022.01);
(Continued)

(58) Field of Classification Search
CPC ........... G06V 40/1318; G06V 40/1329; G06V 10/147; H01L 27/323; H01L 27/3234;
(Continued)

(56) References Cited

U.S. PATENT DOCUMENTS 10,083,335 B2   9/2018  Zhang
10,482,304 B2  11/2019  Zhang
(Continued)

FOREIGN PATENT DOCUMENTS

KR  1020170030536   3/2017
KR  1020180115235  10/2018
(Continued)

OTHER PUBLICATIONS

Tyagi et al., Novel Way of Making High Refractive Index Plastics; Metal Containing Polymers for Optical Applications, Aug. 12, 2009, De Gruyter, e-Polymers, vol. 9, pp. 100, https://doi.org/10.1515/epoly.2009.9.1.1197.*

*Primary Examiner* — Abdul-Samad A Adediran
(74) *Attorney, Agent, or Firm* — F. Chau & Associates, LLC

(57) ABSTRACT

A display device includes a window on which a fingerprint detection region in which fingerprint information is detected is defined, an optical layer disposed below the window and in which at least one transmission hole overlapping the fingerprint detection region is defined, a protection layer disposed below the optical layer, and a sensor. A refractive index of the protection layer is greater than a refractive index of the window. A distance from the optical layer to the window is less than a distance from the optical layer to the sensor.

18 Claims, 10 Drawing Sheets

(51) Int. Cl.
  *G06V 10/147* (2022.01)
  *H10K 59/40* (2023.01)
  *H10K 59/65* (2023.01)
  *H10K 59/122* (2023.01)
  *H10K 77/10* (2023.01)
  *H01L 27/146* (2006.01)
  *H10K 102/00* (2023.01)

(52) U.S. Cl.
  CPC .......... *H10K 59/122* (2023.02); *H10K 59/40* (2023.02); *H10K 59/65* (2023.02); *H10K 77/111* (2023.02); *H01L 27/14623* (2013.01); *H01L 27/14627* (2013.01); *H01L 27/14678* (2013.01); *H10K 2102/311* (2023.02)

(58) Field of Classification Search
  CPC ............ H01L 27/3246; H01L 51/0097; H01L 27/14623; H01L 27/14627; H01L 27/14678; H01L 2251/5338; H01L 31/12; G06F 1/1637; B32B 5/18
  See application file for complete search history.

(56) References Cited

U.S. PATENT DOCUMENTS

| | | | |
|---|---|---|---|
| 10,691,915 | B2 | 6/2020 | Fourre et al. |
| 2017/0249494 | A1* | 8/2017 | Zhang .................. G06F 1/1637 |
| 2019/0050621 | A1* | 2/2019 | Xu ..................... G06V 40/1318 |
| 2019/0171861 | A1 | 6/2019 | Zhang et al. |
| 2019/0311176 | A1* | 10/2019 | Haddad .............. G06V 40/1318 |
| 2020/0022267 | A1* | 1/2020 | Han ......................... B32B 5/18 |
| 2020/0104562 | A1* | 4/2020 | Sung ....................... H01L 31/12 |
| 2021/0028406 | A1* | 1/2021 | Sun ..................... H01L 27/3234 |

FOREIGN PATENT DOCUMENTS

| | | |
|---|---|---|
| KR | 1020190013888 | 2/2019 |
| KR | 10-2098657 | 4/2020 |

\* cited by examiner

DISPLAY DEVICE

CROSS-REFERENCE TO RELATED APPLICATIONS

This U.S. nonprovisional application claims priority under 35 U.S.C. § 119 to Korean Patent Application No. 10-2020-0107996, filed on Aug. 26, 2020 in the Korean Intellectual Property Office, the disclosure of which is hereby incorporated by reference in its entirety.

TECHNICAL FIELD

Embodiments of the present invention relate to a flexible display device that performs folding and unfolding operations about a folding axis and includes a sensor that detects a user's fingerprint information, which can be used for fingerprint authentication.

DISCUSSION OF RELATED ART

Electronic products such as, for example, smartphones, digital cameras, laptop computers, navigation systems, and smart televisions, include a display device for displaying an image to a user. The display device generates an image and provides a user with the image displayed on a display screen.

With the advancement of display technology, various types display devices have recently been developed. A typical example of such display devices is a flexible display device that can be curvedly deformable, foldable, or rollable. A flexible display device capable of being deformed in various shapes allow for increased portability and user convenience.

A foldable display device is a type of flexible display device that can be folded about a folding axis that extends in one direction. A foldable display device may include a flexible display panel and a flexible window disposed o the flexible display panel.

A display device provides various functions that enable a user to interact with the display device. For example, the display device may display an image to provide information to a user, and/or may detect a user's input. Some display devices may also have the function of detecting a user's fingerprint information, which can be used for fingerprint authentication. An optical fingerprint sensor may detect incident light to detect fingerprint information.

SUMMARY

Embodiments of the present invention provide a foldable display device having increased reliability and efficiency when detecting fingerprint authentication information.

According to embodiments of the present invention, a display device includes a window on which a fingerprint detection region in which fingerprint information is detected is defined, an optical layer disposed below the window and in which at least one transmission hole overlapping the fingerprint detection region is defined, a protection layer disposed below the optical layer, and a sensor. A refractive index of the protection layer is greater than a refractive index of the window. A distance from the optical layer to the window is less than a distance from the optical layer to the sensor.

In embodiments, the transmission hole may be provided in plural. When viewed in a plan view, the transmission holes may be spaced apart from each other in a first direction or a second direction that intersects the first direction.

According to embodiments of the present invention, a display device includes an upper layer having a fingerprint detection region disposed on a top surface of the upper layer. The fingerprint detection region receives a light indicating fingerprint information. The display device further includes an optical layer disposed below the upper layer and having a plurality of transmission holes through which the light penetrating the upper layer passes, a lower layer disposed below the optical layer and on which the light passing through the transmission holes is received and passes through, and a sensor. A refractive index of the lower layer is greater than a refractive index of the upper layer. The sensor is disposed below the lower layer and overlaps the fingerprint detection region. The sensor receives the light passing through the lower layer. A thickness of the lower layer is greater than a thickness of the upper layer.

According to embodiments of the present invention, a display device includes a display module including a first non-folding region, a second non-folding region including a fingerprint detection region in which fingerprint information is detected, and a folding region disposed between the first non-folding region and the second non-folding region. The folding region is foldable about a folding axis. The display device further includes a support plate disposed below the display module and in which an opening overlapping the fingerprint detection region is defined, a sensor disposed below the support plate and overlapping the opening, and a protection layer disposed between the display module and the support plate. A refractive index of the protection layer is greater than a refractive index of the display module.

BRIEF DESCRIPTION OF THE DRAWINGS

The above and other features of the present invention will become more apparent by describing in detail embodiments thereof with reference to the accompanying drawings, in which.

DETAILED DESCRIPTION

Figure 1:
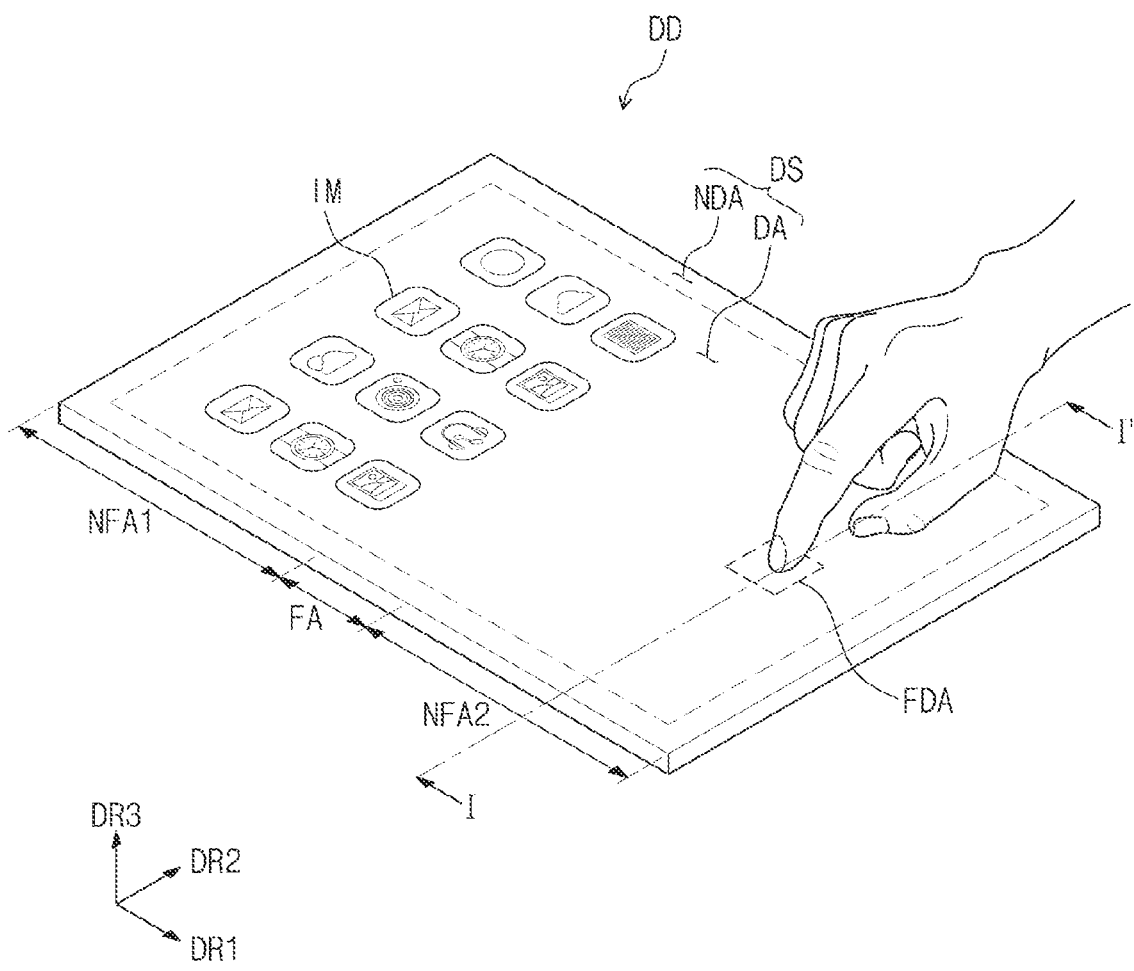
FIG. 1 illustrates a perspective view showing a display device according to embodiments of the present invention.

Embodiments of the present inventions will be described more fully hereinafter with reference to the accompanying drawings. Like reference numerals may refer to like elements throughout the accompanying drawings.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

The term "and/or" includes one or more combinations defined by associated components.

It will be understood that the terms "first," "second," "third," etc. are used herein to distinguish one element from another, and the elements are not limited by these terms. Thus, a "first" element in an embodiment may be described as a "second" element in another embodiment.

Unless the context clearly indicates otherwise, the singular forms are intended to include the plural forms as well.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

It should be understood that descriptions of features or aspects within each embodiment should typically be considered as available for other similar features or aspects in other embodiments, unless the context clearly indicates otherwise.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

Figure 2:
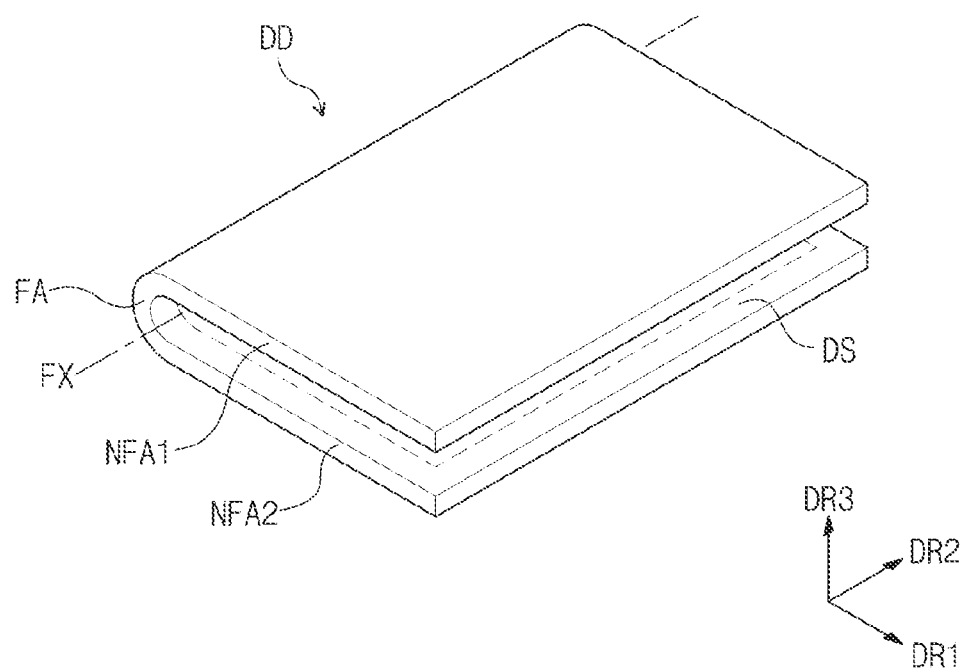
FIG. 2 illustrates a perspective view showing a folded state of the display device depicted in FIG. 1.

FIG. 1 illustrates a perspective view showing a display device according to embodiments of the present invention. FIG. 2 illustrates a perspective view showing a folded state of the display device depicted in FIG. 1.

Referring to FIG. 1, a display device DD according to embodiments of the present invention may have sides that extend in a first direction DR1 and a second direction DR2 intersecting the first direction DR1. The display device DD may have a smaller thickness in a third direction DR3 than in the first direction DR1 or the second direction DR2.

The third direction DR3 is defined herein as a direction that substantially vertically intersects a plane formed by the first and second directions DR1 and DR2. In this description, the phrase "when viewed in a plan view" may mean "when viewed in the third direction DR3."

When viewed in a plan view, the display device DD may have a rectangular shape. The present invention, however, is not limited thereto. For example, according to embodiments, the display device DD may have a circular shape, a polygonal shape, or any other various shapes.

The display device DD may have a top surface defined as a display surface DS, and may have a plane defined by the first and second directions DR1 and DR2. The display surface DS may provide a user with at least one image IM generated by the display device DD.

The display surface DS may include a display region DA and a non-display region NDA around the display region DA. The display region DA may display the at least one image IM, and the at least one image IM is not displayed in the non-display region NDA. The non-display region NDA may surround the display region DA and may provide the display device DD with an edge that is printed with a certain color. For example, the non-display region NDA may provide the display device DD with a bezel having a certain color and which surrounds the display region DA.

According to an embodiment of the present invention, the display device DD may be a foldable display device. For example, the display device DD may include a first non-folding region NFA1, a second non-folding region NFA2, and a folding region FA disposed between the first non-folding region NFA1 and the second non-folding region NFA2. The first non-folding region NFA1, the folding region FA, and the second non-folding region NFA2 may be arranged in the first direction DR1.

Referring to FIG. 2, the display device DD may be foldable about a folding axis FX that extends in the second direction DR2. When the display device DD is folded about the folding axis FX, the top surfaces of the first and second non-folding regions NFA1 and NFA2 may face each other. That is, the display device DD may fold inwards to avoid external exposure of the display surface DS, thus protecting the display surface DS when the display device DD is folded. This folding scheme may be referred to as in-folding.

In an embodiment, the display device DD is foldable about the folding axis FX extending in the second direction DR2, as described above. However, embodiments of the present invention are not limited thereto. For example, according to embodiments, the display device DD may be foldable in different manners. For example, the display device DD may be folded about a folding axis that extends in the first direction DR1. Alternatively, the display device DD may fold outwards about the folding axis FX such that the top surfaces of the first and second non-folding regions NFA1 and NFA2 do not face each other. This folding scheme may be referred to as out-folding.

Referring back to FIG. 1, the display device DD may include a fingerprint detection region FDA. For example, when a user places one's finger on the fingerprint detection region FDA, the display device DD may detect the user's fingerprint, and use the detected fingerprint information for authentication.

According to an embodiment of the present invention, the fingerprint detection region FDA may be defined in the second non-folding region NFA2. However, no limitation is imposed on the position of the fingerprint detection region FDA. For example, according to embodiments, the fingerprint detection region FDA may be defined in any region of the display surface DS.

Figure 3:
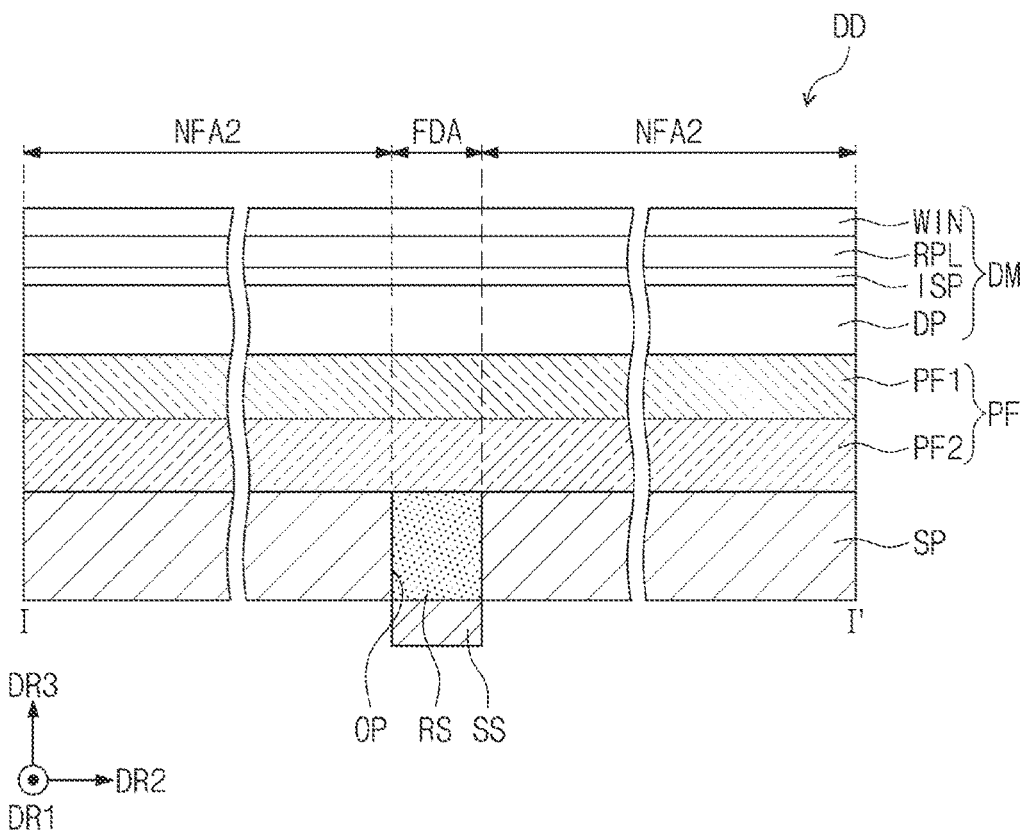
FIG. 3 illustrates a cross-sectional view taken along line I-I' of FIG. 1.
Figure 4:
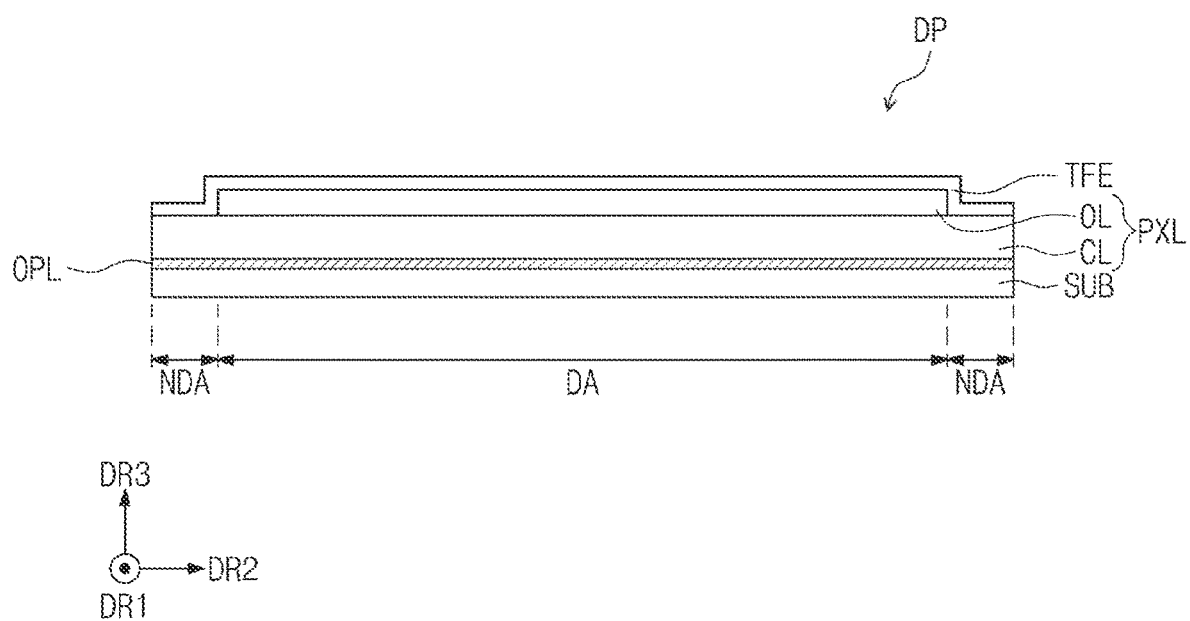
FIG. 4 illustrates a cross-sectional view showing a display panel of FIG. 3.
Figure 5:
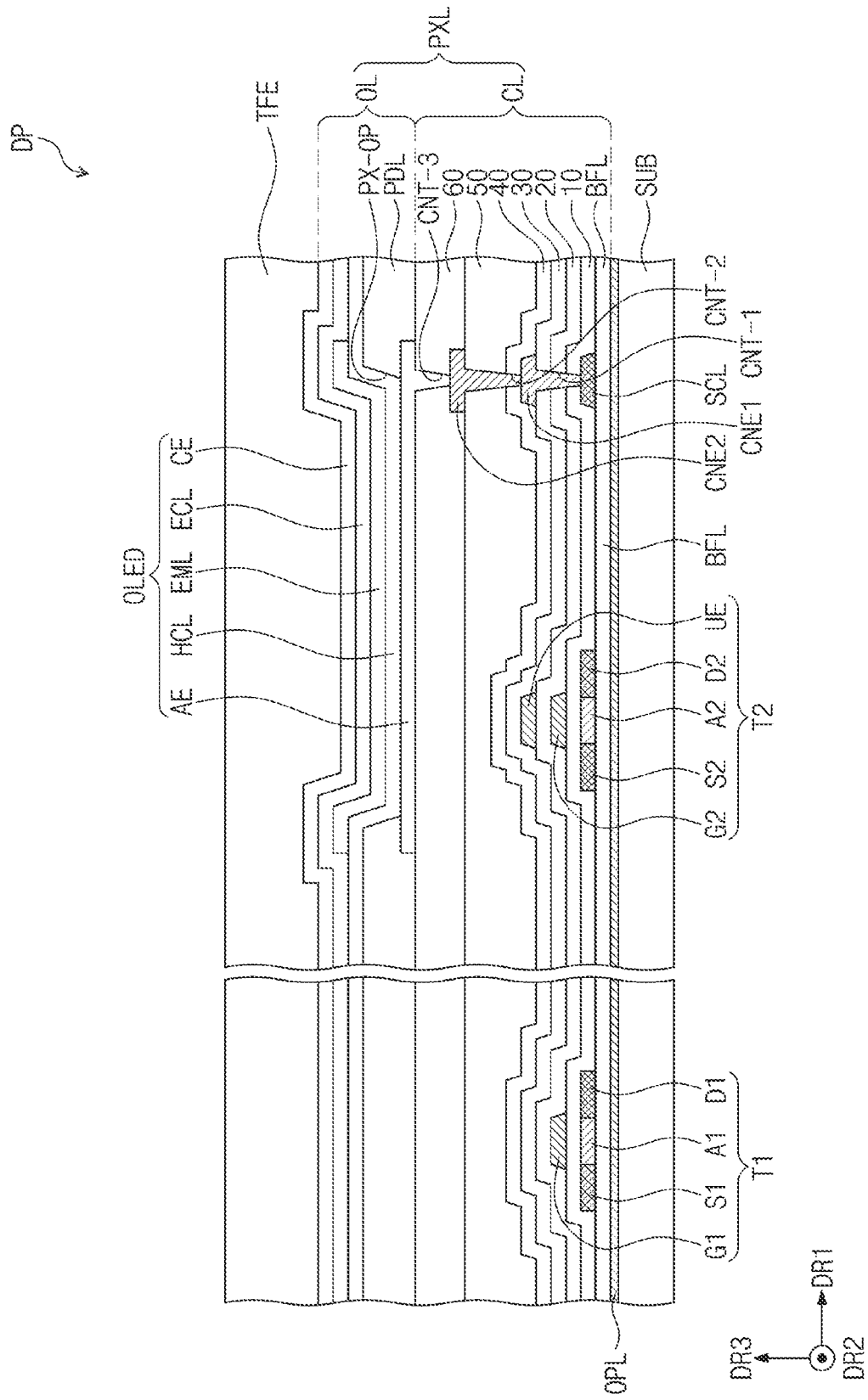
FIG. 5 illustrates a cross-sectional view showing the display panel of FIG. 4 in further detail.

FIG. 3 illustrates a cross-sectional view taken along line I-I' of FIG. 1. FIG. 4 illustrates a cross-sectional view showing a display panel of FIG. 3. FIG. 5 illustrates a cross-sectional view showing the display panel of FIG. 4 in further detail.

Referring to FIG. 3, the display device DD may include a display module DM, a protection layer PF disposed below the display module DM, a support plate SP disposed below the protection layer PF, and a sensor SS disposed below the support plate SP. The protection layer PF may include a first protection layer PF1 and a second protection layer PF2, which are described in further detail below. The support plate SP may include an opening OP and a filler member RS, which are described in further detail below.

The display module DM may generate an image such as, for example, the at least one image IM, and may provide a user with the generated image. The display module DM may include, for example, a window WIN, an antireflection layer RPL, an input sensing part ISP, and a display panel DP.

The window WIN may protect the display panel DP against external impact such as, for example, scratches. An image (e.g., the at least one image IM) generated by the display panel DP may pass through the window WIN and then may be provided to a user. Thus, the window WIN may have optically transparent properties. For example, the window WIN may include glass. However, no limitation is imposed on the material of the window WIN. For example, according to embodiments, the window WIN may include a transparent plastic. The window WIN may have a small thickness, and thus, may be conveniently foldable.

According to an embodiment of the present invention, the fingerprint detection region FDA of FIG. 1 may be substantially defined on a top surface of the window WIN. For example, in an embodiment, the fingerprint detection region FDA, in which fingerprint information of a user may be detected, is defined on the window WIN.

The antireflection layer RPL may be disposed below the window WIN. In an embodiment, the antireflection layer RPL may be a film that prevents reflection of external light. The antireflection layer RPL may reduce a reflectance of external light that is incident on the display panel DP from outside the display device DD. The antireflection layer RPL may include, for example, one or more of a retarder and a polarizer.

The antireflection layer RPL, however, is not limited to the configuration discussed above. For example, according to embodiments, the antireflection layer RPL may be implemented with a plurality of color filters and black matrices.

The input sensing part ISP may be disposed below the antireflection layer RPL. The input sensing part ISP may include a plurality of sensors that detect an external input. The sensors may use a capacitive method to detect the external input. The external input may include, for example, a user's body part such as a finger, light, heat, a pen, pressure, or various other types of external inputs. The display panel DP may be disposed below the input sensing part ISP. The display panel DP may include a light emitting element. A structure of the display panel DP according to an embodiment of the present invention will be described in further detail below with reference to FIG. 4.

Referring to FIG. 4, the display panel DP may include a substrate SUB, an optical layer OPL disposed on the substrate SUB, a circuit element layer CL disposed on the optical layer OPL, a display element layer OL disposed on the circuit element layer CL, and a thin-film encapsulation layer TFE disposed on the display element layer OL. The circuit element layer CL and the display element layer OL may form a pixel layer PXL.

The substrate SUB may include the display region DA and the non-display region NDA around the display region DA. The substrate SUB may include a flexible plastic material.

The optical layer OPL may be disposed on the substrate SUB. However, no limitation is imposed on the position of the optical layer OPL. For example, according to embodiments of the present invention, the optical layer OPL may be disposed on a different location in the display panel DP.

The optical layer OPL may reflect or absorb external light that is incident on the display panel DP. For example, the optical layer OPL may include a metallic material that reflects external light. Alternatively, the optical layer OPL may have a light-absorbing color (e.g., black) that absorbs external light.

The optical layer OPL may prevent recognition of components disposed below the substrate SUB. For example, the optical layer OPL may prevent the components disposed below the substrate SUB from being visually recognized by a user when the user is viewing an image (e.g., the at least one image IM) on the display device DD. The optical layer OPL may control external light to allow the external light to pass through only a certain region of the substrate SUB. This will be further described below.

The pixel layer PXL, which includes the circuit element layer CL and the display element layer OL disposed on the circuit element layer CL, may be disposed on the optical layer OPL.

Referring to FIGS. 4 and 5, the circuit element layer CL may include a buffer layer BFL, a first transistor T1, a second transistor T2, and first to sixth dielectric layers 10, 20, 30, 40, 50 and 60.

The buffer layer BFL may be disposed on the optical layer OPL. The buffer layer BFL may increase an adhesive force between the substrate SUB and a semiconductor pattern.

The first transistor T1 and the second transistor T2 may be disposed on the buffer layer BFL. The first transistor T1 may include a source S1, an active A1, and a drain D1 that are formed from the semiconductor pattern, and the second transistor T2 may include a source S2, an active A2, and a drain D2 that are formed from the semiconductor pattern. That is, each of the first transistor T1 and the second transistor T2 may include a source region, an active region, and a drain region. When viewed in a cross-section, the source S1 and the drain D1 may extend in opposite directions across the active A1, and the source S2 and the drain D2 may extend in opposite directions across the active A2. A connection signal line SCL formed from the semiconductor pattern, when viewed in a plan view, may be connected to the drain D2 of the second transistor T2.

The first dielectric layer 10 may be disposed on the buffer layer BFL, and gates G1 and G2 may be disposed on the first dielectric layer 10. The gates G1 and G2 may each be a portion of a metal pattern. The gates G1 and G2 may overlap the actives A1 and A2, respectively.

The first dielectric layer 10 may be disposed on the source S1, the drain, D1 and the active A1 of the first transistor T1 and on the source S2, the drain D2 and the active A2 of the second transistor T2 with the second dielectric layer 20. The second dielectric layer 20 may cover the gates G1 and G2. Referring to the second transistor T2, an upper electrode UE may be disposed on the second dielectric layer 20. The upper electrode UE may overlap the gate G2 of the second transistor T2. The upper electrode UE may be a portion of a metal pattern. A portion of the gate G2 and its overlying upper electrode UE may define a capacitor. In an embodiment of the present invention, the upper electrode UE may be omitted.

The second dielectric layer 20 may be provided on the gates G1 and G2 with the third dielectric layer 30, which covers the upper electrode UE. A first connection electrode CNE1 may be disposed on the third dielectric layer 30. The first connection electrode CNE1 may be coupled to the connection signal line SCL through a contact hole CNT-1 that penetrates the first to third dielectric layers 10 to 30.

The fourth dielectric layer 40 may be disposed on the third dielectric layer 30. The fifth dielectric layer 50 may be disposed on the fourth dielectric layer 40. The fifth dielectric layer 50 may be an organic layer. A second connection electrode CNE2 may be disposed on the fifth dielectric layer 50. The second connection electrode CNE2 may be coupled to the first connection electrode CNE1 through a contact hole CNT-2 that penetrates the fourth and fifth dielectric layers 40 and 50. The fifth dielectric layer 50 may be disposed on the fourth dielectric layer 40 with the sixth dielectric layer 60, which covers the second connection electrode CNE2. The sixth dielectric layer 60 may be an organic layer.

The display element layer OL may be disposed on the circuit element layer CL. For example, the display element layer OL may be connected to the circuit element layer CL. The display element layer OL may include a pixel definition layer PDL and a light emitting element OLED.

The pixel definition layer PDL may be disposed on the circuit element layer CL. For example, the pixel definition layer PDL may be disposed on the sixth dielectric layer 60. A pixel opening PX-OP may be defined in the pixel definition layer PDL. The light emitting element OLED may be disposed in the pixel opening PX-OP defined in the pixel definition layer PDL.

The light emitting element OLED may include a first electrode AE, a hole control layer HCL, an emission layer EML, an electron control layer ECL, and a second electrode CE.

The first electrode AE may be disposed on the sixth dielectric layer 60. The first electrode AE may be connected to the second connection electrode CNE2 through a contact hole CNT-3 that penetrates the sixth dielectric layer 60. At least a portion of the first electrode AE may be exposed to the pixel opening PX-OP of the pixel definition layer PDL. The first electrode AE may reflect light. For example, the first electrode AE may include a reflection electrode.

The hole control layer HCL may be disposed on the first electrode AE. The hole control layer HCL may include a hole transport layer and further include a hole injection layer. The emission layer EML may be disposed on the hole control layer HCL. The emission layer EML may be disposed in a region that corresponds to the pixel opening PX-OP.

The electron control layer ECL may be disposed on the emission layer EML. The electron control layer ECL may include an electron transport layer and an electron injection layer. The second electrode CE may be disposed on the electron control layer ECL. The second electrode CE may be disposed on the pixel definition layer PDL. The second electrode CE may include a transparent electrode.

The thin-film encapsulation layer TFE may be disposed on the second electrode CE. The thin-film encapsulation layer TFE may cover the display element layer OL. The thin-film encapsulation layer TFE may include, for example, an inorganic layer, an organic layer, and an inorganic layer that are sequentially stacked. The inorganic layers may include an inorganic material, and may protect pixels against, for example, moisture and/or oxygen. The organic layer may include an organic material, and may protect pixels against foreign substances such as, for example, dust particles.

The structure of the display panel DP shown in FIGS. 4 and 5 is merely an example, and embodiments of the present invention are not limited thereto. For example, according to embodiments, the display panel DP may include a glass encapsulation substrate instead of the thin-film encapsulation layer TFE, and may also include, on an edge of the substrate SUB, a sealing layer that connects the substrate SUB and the encapsulation substrate. The thin-film encapsulation layer TFE and the encapsulation substrate may each be defined as a cover layer that covers pixels.

The display module DM may further include functional layers. For example, the display module DM may further include a shock absorption layer disposed between the window WIN and the antireflection layer RPL. The shock absorption layer may absorb an external impact that is applied to the display panel DP from outside the display device DD. Alternatively, the display module DM may further include a window protection layer disposed on the window WIN. The window protection layer may include, for example, a flexible plastic material.

According to an embodiment of the present invention, the display module DM may be configured such that remaining layers other than the optical layer OPL may have substantially the same refractive index as that of the window WIN. For example, when the window WIN includes glass, the refractive index of the remaining layers other than the optical layer OPL in the display module DM may have a value of about 1.5.

The display module DM may include a plurality of conductive patterns formed of metal, and may also include a plurality of dielectric layers including a dielectric material. The plurality of conductive patterns and the plurality of dielectric layers may be disposed on the optical layer OPL. The dielectric layers may include organic and inorganic dielectric layers. The remaining layers of the display module DM may be defined as organic and inorganic dielectric layers that allow light to pass therethrough (e.g., optically transparent layers), and the organic and inorganic dielectric layers may have a refractive index of about 1.5. In an embodiment, the refractive index of the optically transparent organic and inorganic dielectric layers disposed on the optical layer OPL may be about the same as the refractive index of the window WIN.

The conductive patterns may include the electrodes AE and CE of the light emitting element OLED shown in FIG. 5, and may also include the gates G1 and G2, the sources S1 and S2, and the drains D1 and D2 shown in FIG. 5. The organic and inorganic dielectric layers may include the first to sixth dielectric layers 10 to 60 and the thin-film encapsulation layer TFE shown in FIG. 5. The organic and inorganic dielectric layers may include a plurality of dielectric layers that may be disposed in the input sensing part ISP and the antireflection layer RPL shown in FIG. 3.

Referring back to FIG. 3, the protection layer PF may be disposed below and protect the display module DM. The protection layer PF may include a flexible material. The protection layer PF may fold together with the display module DM.

According to an embodiment of the present invention, the protection layer PF may include a material having a refractive index greater than that of the display module DM. For example, the protection layer PF may include a material having a refractive index greater than that of glass. For example, in an embodiment, a refractive index of the protection layer PF may be greater than a refractive index of the window WIN of the display module DM.

The protection layer PF may have a multi-layered structure. In an embodiment, the protection layer PF may include a first protection layer PF1 and a second protection layer PF2, as shown in FIG. 3. The second protection layer PF2 may be disposed below the first protection layer PF1.

The first protection layer PF1 may have a first refractive index. The first refractive index may be greater than a refractive index of glass. For example, the first refractive index may be greater than about 1.5. The second protection layer PF2 may have a second refractive index. The second refractive index may be greater than the first refractive index.

However, no limitation is imposed on the structure of the protection layer PF. For example, according to embodiments of the present invention, the protection layer PF may have a single-layered structure. For example, the protection layer PF may be formed of a single layer including one of the first and second protection layers PF1 and PF2, or the protection layer PF may be a multi-layered structure including the first and second protection layers PF1 and PF2.

According to an embodiment of the present invention, the support plate SP may be disposed below the protection layer PF. The support plate SP may fold together with the display module DM, and may increase mechanical rigidity of the display device DD. The support plate SP may include, for example, stainless steel. However, no limitation is imposed on the material of the support plate SP.

The support plate SP may have an opening OP defined therein. The opening OP may overlap the fingerprint detection region FDA. The opening OP may penetrate the support plate SP in a thickness direction (or the third direction DR3) of the support plate SP. Herein, the third direction DR3 may also be referred to herein as a thickness direction of the display device DD.

The support plate PP may include a filler member RS disposed in the opening OP. The filler member RS may have optically transparent properties. For example, the filler member RS may include a transparent polymer resin.

In an embodiment, the refractive index of the the filler member RS may be about the same as the second refractive index of the second protection layer PF2. When the protection layer PF has a single-layered structure formed of one of the first and second protection layers PF1 and PF2, the filler member RS may have a refractive index about the same as that of the single-layered protection layer PF.

Embodiments of the present invention, however, are not limited thereto. For example, according to embodiments, the filler member RS may include a material having a refractive index greater or less than the second refractive index of the second protection layer PF2. In addition, when the protection layer PF has a single-layered structure formed of one of the first and second protection layers PF1 and PF2, the filler member RS may have a refractive index greater or less than that of the single-layered protection layer PF.

The filler member RS disposed in the opening OP may increase mechanical rigidity of the support plate PP. The filler member RS may have optically transparent properties, and thus, may allow incident light to pass therethrough.

According to an embodiment of the present invention, the sensor SS may be disposed below the filler member RS of the support plate PP. The sensor SS may overlap the fingerprint detection region FDA. The sensor SS may detect fingerprint information of a user, which may be used for authentication purposes. Such fingerprint information may also be referred to herein as fingerprint authentication information. The fingerprint authentication information may be indicated by a light received by the fingerprint detection region FDA when a user places his or her finger on or near the fingerprint detection region FDA.

The sensor SS may be, for example, an optical fingerprint sensor. The sensor SS may be provided with a user's fingerprint information through light that is incident on the fingerprint detection region FDA. The sensor SS may additionally include an optical system. For example, the sensor SS may include a collimator layer.

The sensor SS may block light having a specific wavelength. For example, the sensor SS may include an infrared cut filter. The infrared cut filter may block an infrared ray emitted from external light. The infrared cut filter may block an infrared ray that travels toward the sensor SS from outside the sensor SS. When the sensor SS is provided with an infrared ray emitted from external light, no fingerprint may be normally detected. The infrared cut filter may prevent a fingerprint sensor from receiving an infrared ray emitted from external light.

In an embodiment, the infrared cut filter is not disposed inside the sensor SS, but rather, is disposed outside the sensor SS. In this case, the infrared cut filter may be placed between the sensor SS and the filler member RS.

In an embodiment, the sensor SS does not directly contact the filler member RS. For example, in an embodiment, an adhesive and a barrier layer may further be disposed between the sensor SS and the filler member RS. The adhesive may be disposed between the sensor SS and the filler member RS, and the sensor SS may be attached through the adhesive to the filler member RS. The barrier layer may be disposed between the sensor SS and the filler member RS. The barrier layer may protect the sensor SS, and may be implemented as a film attached to the sensor SS.

Various layers may be disposed between the protection layer PF and the support plate SP. For example, a cushion layer and a barrier layer may further be disposed between the protection layer PF and the support plate SP.

The barrier layer may be disposed below the protection layer PF, and may cause the display module DM to have an increased resistance to compressive force caused by external pressure. The barrier layer may include a flexible plastic material such as, for example, polyimide or polyethyleneterephthalate.

The cushion layer may be disposed below the barrier layer. The cushion layer may absorb an external impact applied to a lower portion of the display module DM, thereby protecting the display panel DP. The cushion layer may include a resilient foam sheet. The cushion layer may include, for example, foam, sponge, polyurethane, or thermoplastic polyurethane.

Figure 6:
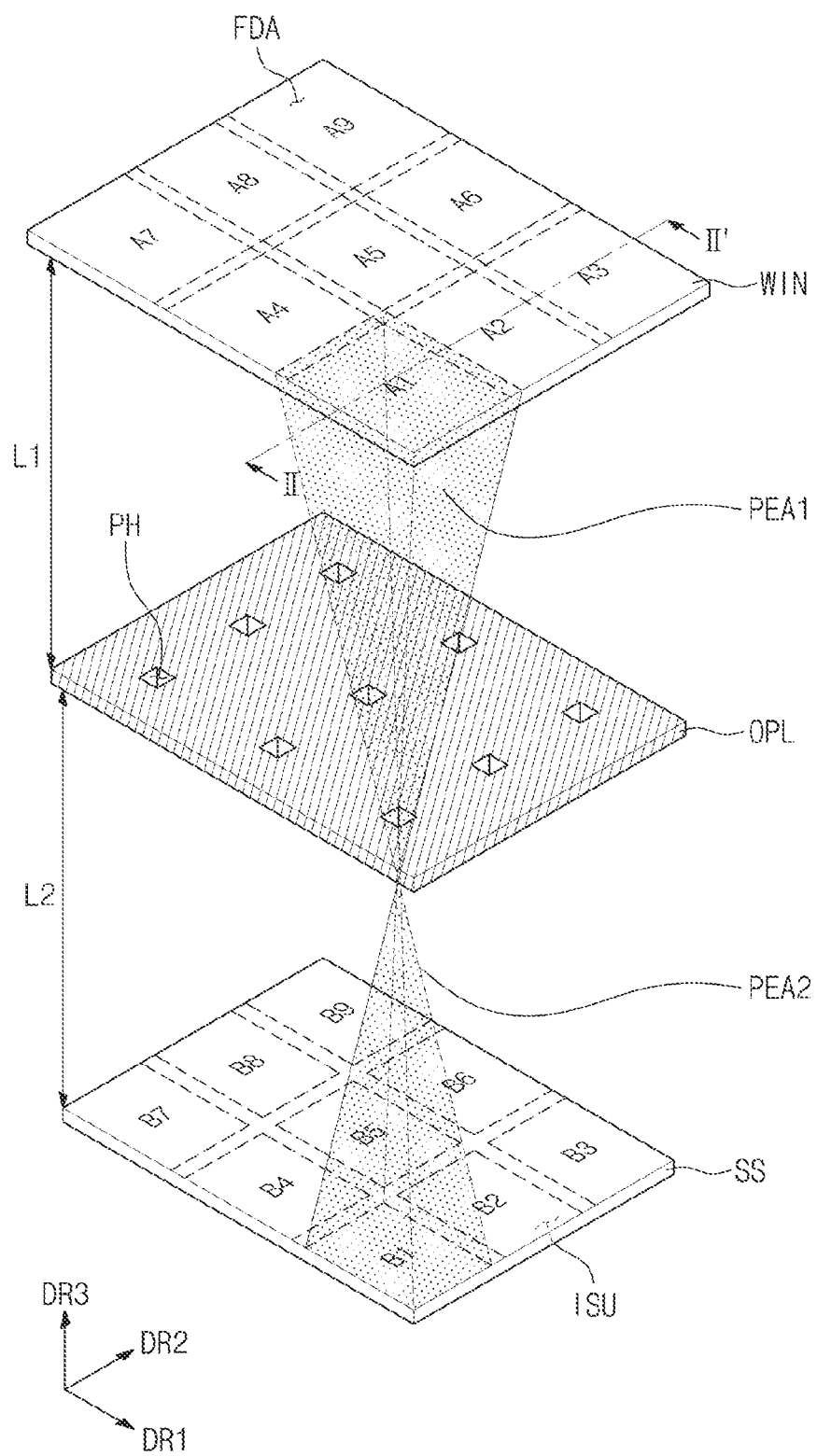
FIG. 6 illustrates a perspective view showing a window, an optical layer, and a sensor that overlap a fingerprint detection region of FIG. 3.

FIG. 6 illustrates a perspective view showing a window, an optical layer, and a sensor that overlap a fingerprint detection region of FIG. 3. For convenience of description, FIG. 6 omits the illustration of layers other than the window WIN, the optical layer OPL of the display panel DP, and the sensor SS.

Referring to FIG. 6, at least one transmission hole PH may be defined in the optical layer OPL between the window WIN and the sensor SS. For example, as shown in FIG. 6, the optical layer OPL may have a plurality of transmission holes PH. The transmission holes PH may be arranged and spaced apart from each other in the first and second directions DR1 and DR2. The transmission holes PH may penetrate the optical layer OPL in a thickness direction (e.g., the third direction DR3) of the optical layer OPL. The transmission holes PH may be defined as an optical system.

FIG. 6 depicts, by way of example, nine transmission holes PH that overlap the fingerprint detection region FDA. However, embodiments of the present invention are not limited thereto. For example, according to embodiments of the present invention, the number of the transmission holes PH overlapping the fingerprint detection region FDA may be greater than nine or less than nine.

Each of the transmission holes PH may have a tetragonal shape when viewed in a plan view. However, no limitation is imposed on the shape of the transmission holes PH. For example, according to embodiments, the transmission holes PH may have polygonal shapes, circular shapes, or any other suitable shapes.

According to an embodiment of the present invention, the fingerprint detection region FDA may be divided into a plurality of first regions A1 to A9. The first regions A1 to A9 may be arranged in the first and second directions DR1 and DR2. Each of the first regions A1 to A9 may have a tetragonal shape when viewed in a plan view.

A sum of areas of the first regions A1 to A9 may be identical to an area of the fingerprint detection region FDA. That is, the fingerprint detection region FDA may correspond to the first regions A1 to A9. In an embodiment, when viewed in a plan view, the first regions A1 to A9 may partially overlap each other. The first regions A1 to A9 may partially overlap each other in the first and second directions DR1 and DR2. The first regions A1 to A9 may overlap each other at their portions adjacent to their edges.

According to an embodiment of the present invention, the sensor SS may have a light incident surface ISU that is divided into a plurality of second regions B1 to B9. The second regions B1 to B9 may be arranged in the first and second directions DR1 and DR2. Each of the second regions B1 to B9 may have a tetragonal shape when viewed in a plan view.

A sum of areas of the second regions B1 to B9 may be about equal to an area of the light incident surface ISU of the sensor SS. That is, the light incident surface ISU may correspond to the second regions B1 to B9. In an embodiment, when viewed in a plan view, the second regions B1 to B9 do not overlap each other. The second regions B1 to B9 may be spaced apart from each other in the first and second directions DR1 and DR2. Each of the second regions B1 to B9 may include a plurality of sensor pixels.

According to an embodiment of the present invention, the first regions A1 to A9 may have a one-to-one correspondence with the transmission holes PH of the optical layer OPL, and may have a one-to-one correspondence with the second regions B1 to B9. For example, in an embodiment, a corresponding first region A1, transmission hole PH and second region B1 may overlap each other, and this arrangement may be repeated among corresponding first regions A1, transmission holes PH and second regions B1 According to embodiments of the present invention, the first regions A1 to A9, the transmission holes PH, and the second regions B1 to B9 may have a one-to-one correspondence with each other.

According to an embodiment of the present invention, a first light transmission path PEA1 may be defined between the first region A1 and the transmission hole PH that correspond to each other. The first light transmission path PEA1 may be defined above the transmission hole PH.

When external light is incident on the first region A1, the external light may travel along the first light transmission path PEA1 that serves as a pathway allowing the external light to reach the transmission hole PH. The first light transmission path PEA1 may also be defined between each of other first regions A2 to A9 and its corresponding transmission hole PH. However, these additional first light transmission paths PEA1 are omitted in FIG. 6 for convenience of illustration.

According to an embodiment of the present invention, a second light transmission path PEA2 may be defined between the second region B1 and the transmission hole PH that correspond to each other. The second light transmission path PEA2 may be defined below the transmission hole PH.

The second light transmission path PEA2 may be continuous with the first light transmission path PEAL When light passes through the transmission hole PH, the light may travel along the second light transmission path PEA2 that serves as a pathway allowing the light to reach the second region B1 of the light incident surface ISU. The second light transmission path PEA2 may also be defined between each of other second regions B2 to B9 and its corresponding transmission hole PH. However, these additional second light transmission paths PEA2 are omitted in FIG. 6 for convenience of illustration.

According to an embodiment of the present invention, a first length L1 from the optical layer OPL to the window WIN may be less than a second length L2 from the optical layer OPL to the sensor SS. For example, when viewed in the third direction DR3, a length from the transmission holes PH to their corresponding first regions A1 to A9 may be less than a length from the transmission holes PH to their corresponding second regions B1 to B9.

Figure 7:
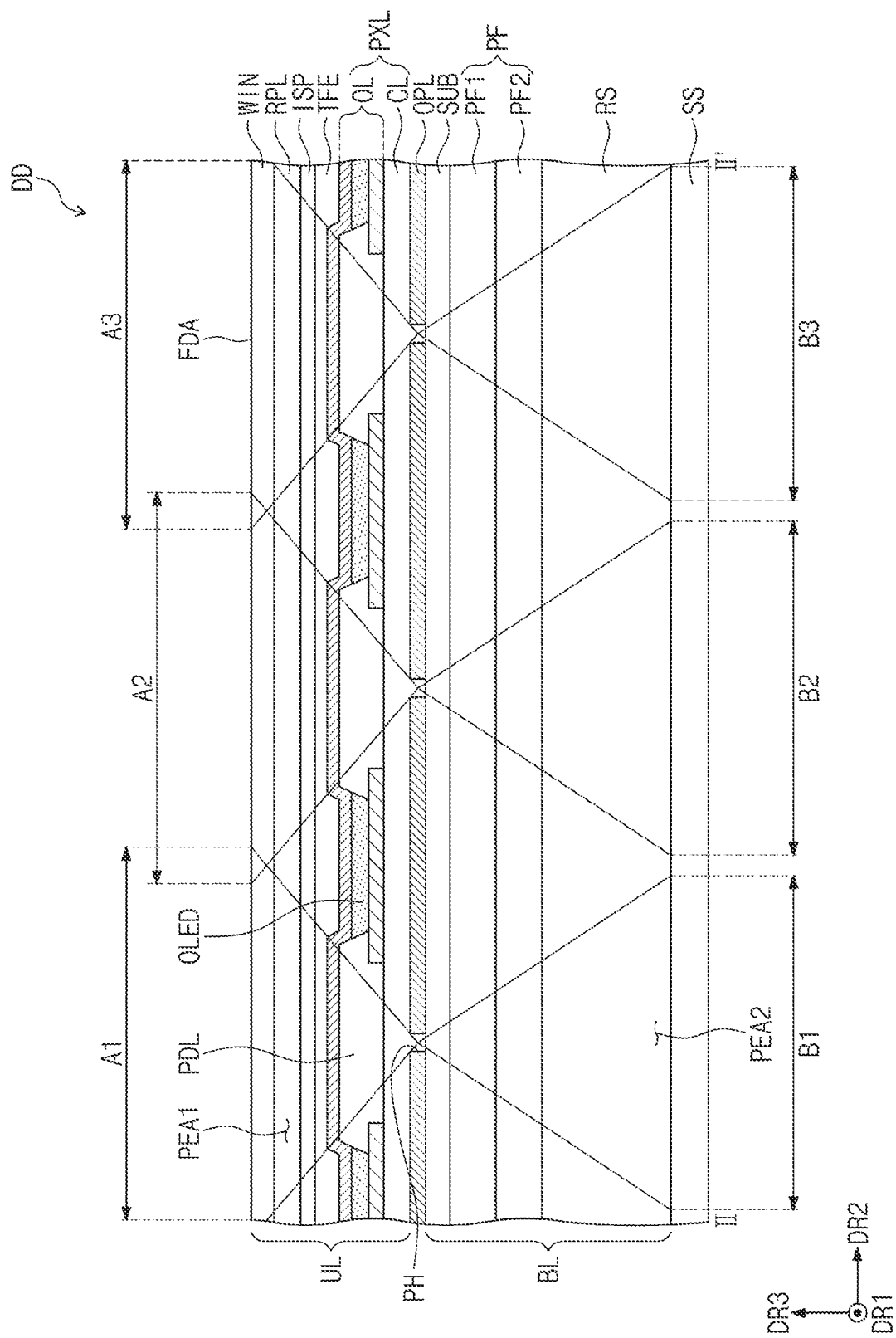
FIG. 7 illustrates a cross-sectional view taken along line II-IP of FIG. 6.

FIG. 7 illustrates a cross-sectional view taken along line II-II' of FIG. 6. For convenience of description, in FIG. 7, an upper layer UL may indicate a group including the pixel layer PXL, the thin-film encapsulation layer TFE, the input sensing part ISP, the antireflection layer RPL, and the window WIN that are disposed on the optical layer OPL, and a lower layer BL may indicate a group including the substrate SUB, the protection layer PF, and the filler member RS of the support plate SP that are disposed between the optical layer OPL and the sensor SS. The refractive index of the lower layer BL may be greater than the refractive index of the upper layer UL. The refractive index of the lower layer BL may be greater than the refractive index of glass.

The first length L1 illustrated in FIG. 6 may substantially correspond to a thickness of the upper layer UL, and the second length L2 illustrated in FIG. 6 may substantially correspond to a thickness of the lower layer BL. Thus, in an embodiment, the thickness of the lower layer BL may be greater than the thickness of the upper layer UL.

Referring to FIGS. 6 and 7, the first regions A1, A2 and A3 may partially overlap each other. The first regions A1, A2, and A3 may overlap each other at their portions adjacent to their edges. For example, as shown in FIG. 7, a portion of the first region A1 adjacent to an edge of the first region 1*l* may overlap a portion of the first region A2 adjacent to an edge of the first region A2. Similarly, a portion of the first region A2 adjacent to another edge of the first region A2 may overlap a portion of the first region A3 adjacent to an edge of the first region A3.

The first light transmission path PEA1 may be defined in the upper layer UL. The first light transmission path PEA1 may have an area that decreases in a downward direction. That is, the area of the first light transmission path PEA1 may decrease in a direction away from the window WIN and toward the optical layer OPL. For example, the area of the first light transmission path PEA1 may be largest at an upper portion of the window WIN, and may be smallest at a lower portion of the circuit element layer CL.

In an embodiment, the first light transmission path PEA1 may be defined in the pixel definition layer PDL of the display element layer OL, and is not defined in the light emitting element OLED of the display element layer OL. For example, in an embodiment, as shown in FIG. 7, the transmission hole PH may overlap the pixel definition layer PDL, and does not overlap the light emitting element OLED.

According to an embodiment of the present invention, the upper layer UL may have optically transparent properties at its portions where the first light transmission path PEA1 is defined. Therefore, external light incident on the fingerprint detection region FDA may travel through the first light transmission path PEA1 to reach the transmission hole PH of the optical layer OPL.

The second light transmission path PEA2 may be defined in the lower layer BL. The second light transmission path PEA2 may have an area that increases in a downward direction. That is, the area of the second light transmission path PEA2 may increase in a direction away from the optical layer OPL and toward the sensor SS. For example, the area of the second light transmission path PEA2 may be largest at a lower portion of the filler member RS, and may be smallest at an upper portion of the substrate SUB.

According to an embodiment of the present invention, the lower layer BL may have optically transparent properties at its portions where the second light transmission path PEA2 is defined. Therefore, light that passes through the transmission hole PH may travel through the second light transmission path PEA2 to reach the light incident surface ISU of the sensor SS.

According to an embodiment of the present invention, the second regions B1, B2, and B3 do not overlap each other along the second light transmission path PEA2. When the second regions B1, B2, and B3 overlap each other, no fingerprint may be normally detected. For example, when the second regions B1, B2, and B3 overlap each other, overlapping portions may be redundantly provided with a fingerprint, and thus, may not properly recognize the fingerprint. In this case, fingerprint authentication errors may occur. However, in embodiments of the present invention, because the second regions B1, B2, and B3 do not overlap each other along the second light transmission path PEA2, a fingerprint may be normally detected.

As a result, the sensor SS may detect light that is incident on the fingerprint detection region FDA and may receive a user's fingerprint authentication information.

Figure 8:
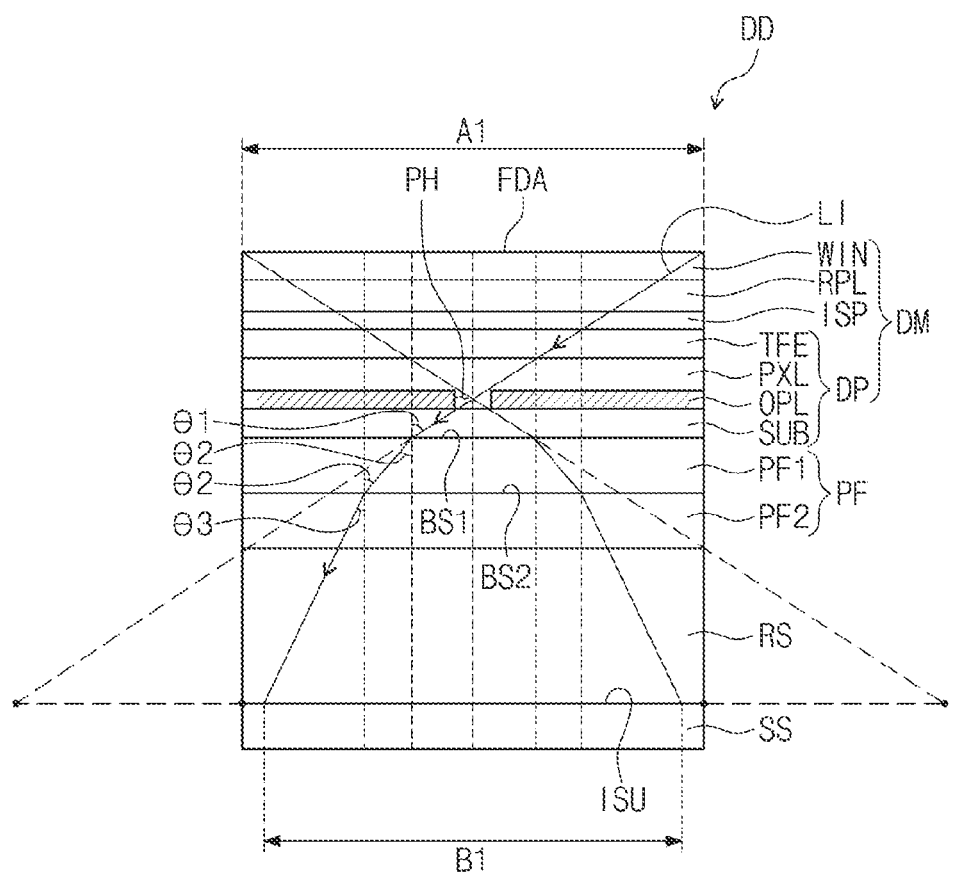
FIG. 8 illustrates a cross-sectional view showing a pathway of light that is incident on a first region and reaches a second region of FIG. 6.

FIG. 8 illustrates a cross-sectional view showing a pathway of light that is incident on a first region and reaches a second region of FIG. 6.

Referring to FIG. 8, a light LI may be incident on the first region A1 of the fingerprint detection region FDA of the window WIN, and may reach the second region B1 of the light incident surface ISU of the sensor SS. The light LI may be assumed to be light that is incident on an outermost part of the first light transmission path PEA1 shown in FIG. 6.

According to an embodiment of the present invention, each layer (e.g., organic and inorganic layers) of the display module DM may have a refractive index substantially the same as that of glass. For example, each layer of the display module DM may have a refractive index of about 1.5. Therefore, the light LI may travel substantially straightly without being refracted in the display module DM.

The light LI may be reflected at a first boundary surface BS1 between the substrate SUB and the first protection layer PF1. The first protection layer PF1 may have a first refractive index greater than a refractive index (e.g., about 1.5) of glass. Therefore, at the first boundary surface BS1, a first angle $\theta1$ (or an incidence angle) of the light LI may be greater than a second angle $\theta2$ (or a refraction angle) of the light LI.

The light LI may be refracted again at a second boundary surface BS2 between the first protection layer PF1 and the second protection layer PF2. The second protection layer PF2 may have a second refractive index greater than the first refractive index of the first protection layer PF1. Therefore, at the second boundary surface BS2, the second angle $\theta2$ (or an incidence angle) of the light LI may be greater than a third angle $\theta3$ (or a refraction angle) of the light LI.

In an embodiment, the filler member RS may have a refractive index substantially the same as the second refractive index of the second protection layer PF2. Therefore, the light LI may travel substantially straightly without being refracted at a boundary between the second protection layer PF2 and the filler member RS. The light LI may pass through the filler member RS to thereby reach the second region B1.

When the protection layer PF below the display module DM has a refractive index substantially the same as or less than that of the display module DM, the light LI incident on the first region A1 may reach an outside of the second region B1. In this case, the sensor SS may not detect a portion of fingerprint information contained in the light LI, and thus, an operation failure of the sensor SS may occur. The operation failure of the sensor SS may correspond to the aforementioned case in which the second regions B1, B2, and B3 overlap or partially overlap each other. In contrast, according to embodiments of the present invention, the display device DD may include the protection layer PF disposed below the display module DM and having a refractive index greater than that of the display module DM. Therefore, according to embodiments of the present invention, the light LI incident on the first region A1 may be controlled to have a pathway to stably reach the second region B1. Accordingly, reliability of the sensor SS may increase. The normal operation of the sensor SS may correspond to the aforementioned case in which the second regions B1, B2, and B3 do not overlap each other.

Figure 9:
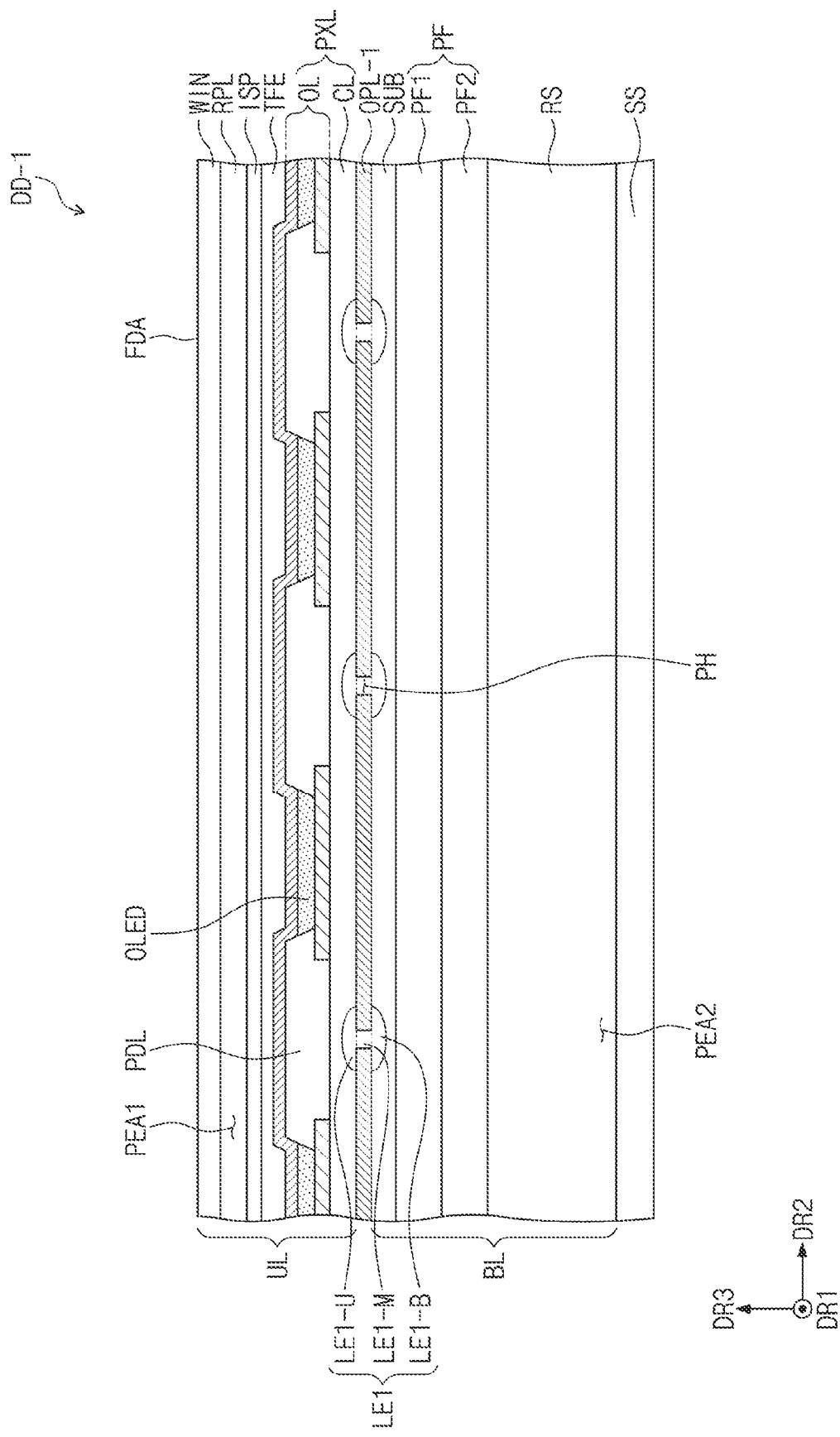
FIGS. 9 and 10 illustrate cross-sectional views showing a display device according to embodiments of the present invention.
Figure 10:
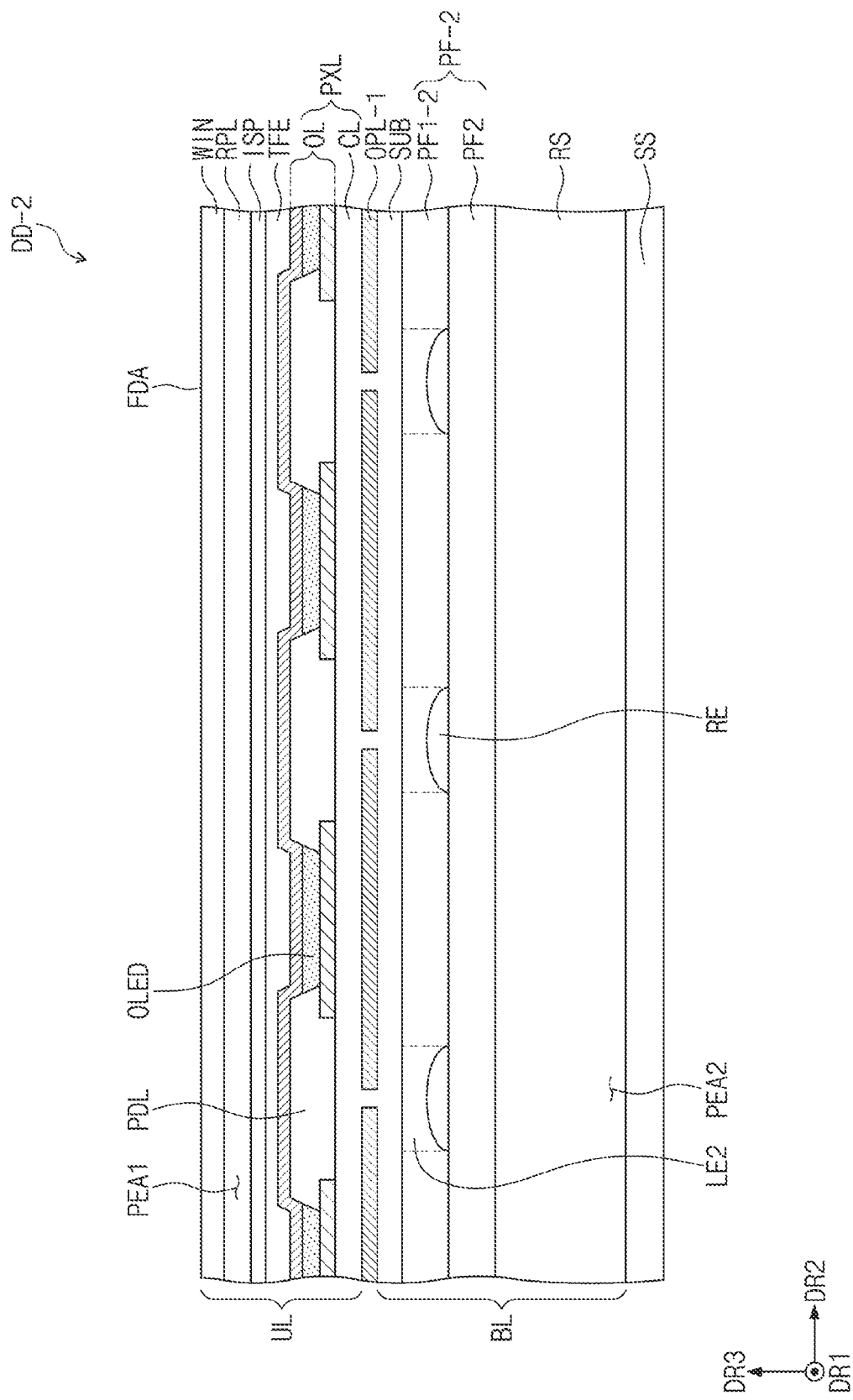

FIGS. 9 and 10 illustrate cross-sectional views showing a display device according to embodiments of the present invention.

Referring to FIGS. 9 and 10, for convenience of explanation, a further description of features and elements previously described may be omitted, and differences thereof will be mainly discussed.

Referring to FIG. 9, an optical layer OPL-1 may further include a plurality of first lenses LE1. A single first lens LE1 may be disposed in each of the transmission holes PH. A single first lens LE1 may include, for example, an upper lens LE1-U, a lower lens LE1-B, and a middle lens LE1-M.

The upper lens LE1-U may be disposed on a top surface of the optical layer OPL-1 adjacent to the transmission hole PH. The upper lens LE1-U may have a convex shape in the third direction DR3.

The lower lens LE1-B may be disposed below a bottom surface of the optical layer OPL-1 adjacent to the transmission hole PH. The lower lens LE1-B may have a convex shape in the third direction DR3.

The middle lens LE1-M may be disposed between the upper lens LE1-U and the lower lens LE1-B. The middle lens LE1-M may be disposed in the transmission hole PH.

The upper lens LE1-U, the lower lens LE1-B, and the middle lens LE1-M may be fabricated integrally or independently and then disposed.

The first lens LE1, however, is not limited to that described above. For example, in an embodiment, one or two of the upper lens LE1-U, the lower lens LE1-B, and the middle lens LE1-M may be omitted from the first lens LEE In addition, the upper lens LE1-U and the lower lens LE1-B may be a concave lens in the third direction DR3.

According to an embodiment of the present invention, a display device DD-1 may further include the first lens LE1 disposed in the transmission hole PH, as described above, and thus, a pathway of external light that travels toward the sensor SS may be efficiently controlled.

The first lens LE1 may refract light toward the sensor SS. As the first lens LE1 has a convex lens shape, light may be intensively provided to each of the second regions B1 to B9, without being widely spread out.

Referring to FIG. 10, a protection layer PF-2 may include a plurality of second lens LE2. Each of the plurality of second lens LE2 may overlap the corresponding transmission hole PH. In an embodiment, the second lens LE2 may be disposed on a first protection layer PF1-2.

The second lens LE2 may be defined by a recession RE formed on the first protection layer PF1-2. For example, the first protection layer PF1-2 may have, on a bottom surface thereof, a plurality of recessions RE recessed in the third direction DR3. Each of the recessions RE may overlap its corresponding transmission hole PH. The first protection layer PF1-2 may have a concave shape in the third direction DR3 on its bottom surface that overlaps the recession RE. Therefore, the first protection layer PF1-2 may serve as lenses at its portions (or the second lenses LE2) that overlap the recessions RE.

The second lens LE2, however, is not limited to that described above. For example, the second lens LE2 may be disposed on a top surface of the first protection layer PF1-2. Alternatively, the second lens LE2 may be disposed on a bottom or top surface of a second protection layer PF2.

According to an embodiment of the present invention, a display device DD-2 may further include the second lens LE2 disposed on the protection layer PF-2, as described above, and thus, a pathway of external light that travels toward the sensor SS may be efficiently controlled.

The second lens LE2 may refract light toward the sensor SS. As the second lens LE2 has a convex lens shape, light may be intensively provided to each of the second regions B1 to B9, without being widely spread out.

Figure 11:
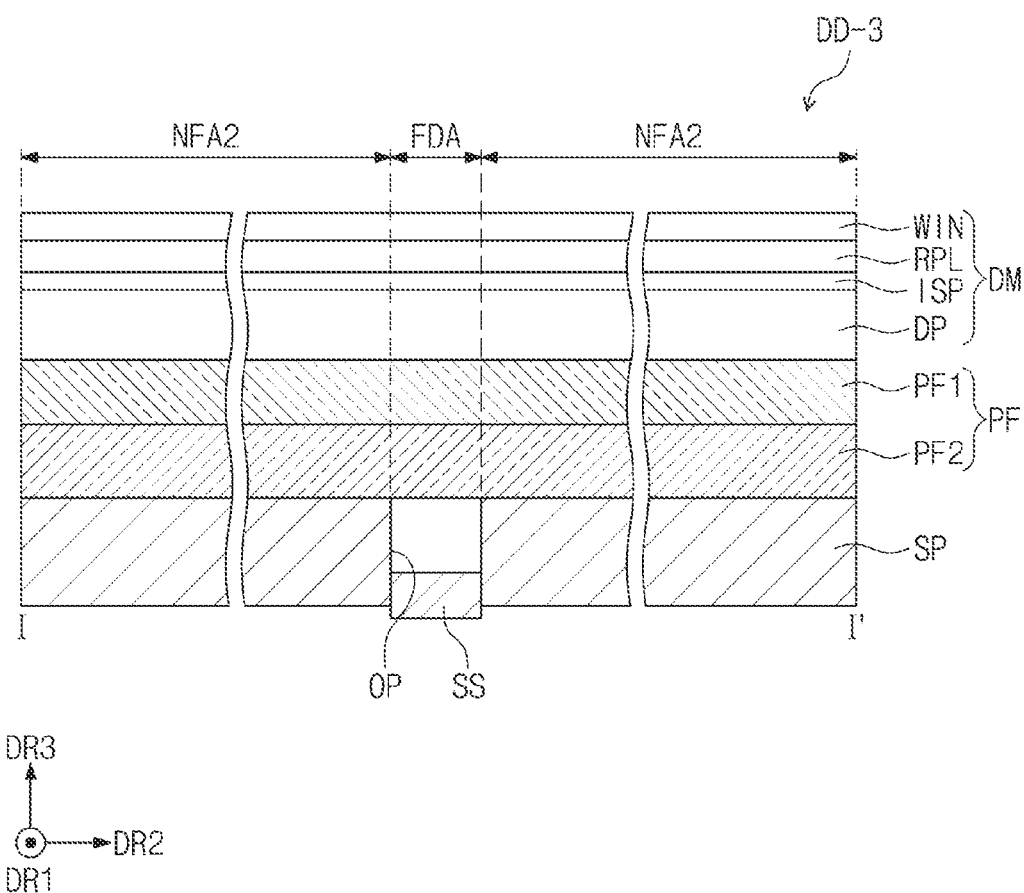
FIG. 11 illustrates a cross-sectional view showing a display device according to embodiments of the present invention.

FIG. 11 illustrates a cross-sectional view showing a display device according to embodiments of the present invention.

Referring to FIG. 11, the support plate SP may have the opening OP that overlaps the fingerprint detection region FDA. In an embodiment according to FIG. 11, the display device DD-3 does not include the filler member RS. For example, in an embodiment according to FIG. 11, the opening OP does not include the filler member RS disposed therein.

The sensor SS may be disposed in the opening OP. As described above, the first protection layer PF1 may have a first refractive index greater than a refractive index (e.g., about 1.5) of glass, and the second protection layer PF2 may have a second refractive index greater than the first refractive index of the first protection layer PF1. Therefore, as described above, the sensor SS may efficiently receive light that is refracted at the first and second protection layers PF1 and PF2.

According to embodiments of the present invention, a display device may include a protection layer disposed below a display module and having a refractive index greater than that of the display module. Thus, a pathway of light that is incident on a fingerprint detection region may be efficiently controlled, thereby causing a sensor to stably receive the light. As a result, operating reliability of the sensor may increase.

While the present invention has been particularly shown and described with reference to the embodiments thereof, it will be understood by those of ordinary skill in the art that various changes in form and detail may be made therein without departing from the spirit and scope of the present invention as defined by the following claims.

What is claimed is:
1. A display device, comprising:
a window on which a fingerprint detection region in which fingerprint information is detected is defined;
an optical layer disposed below the window and in which at least one transmission hole overlapping the fingerprint detection region is defined;
a protection layer disposed below the optical layer,
wherein a refractive index of the protection layer is greater than a refractive index of the window; and
a sensor disposed below the protection layer and overlapping the fingerprint detection region,
wherein a distance from the optical layer to the window is less than a distance from the optical layer to the sensor,
wherein the protection layer comprises:
a first protection layer having a first refractive index; and
a second protection layer disposed below and in direct contact with the first protection layer and having a second refractive index greater than the first refractive index,
wherein the first protection layer and the second protection layer are in continuous direct contact with each other in an area below the optical layer and overlapping the at least one transmission hole, and in an area below the optical layer and between the at least one transmission hole and an adjacent transmission hole defined in the optical layer.

2. The display device of claim 1, wherein
the transmission hole is one of a plurality of transmission holes, and
when viewed in a plan view, the transmission holes are spaced apart from each other in a first direction or a second direction that intersects the first direction.

3. The display device of claim 2, wherein
when viewed in the plan view, the fingerprint detection region is divided into a plurality of first regions having a one-to-one correspondence with the transmission holes, and
the first regions partially overlap each other.

4. The display device of claim 2, wherein the sensor includes a light incident surface on which light incident from the fingerprint detection region is received,
wherein, when viewed in the plan view, the light incident surface is divided into a plurality of regions having a one-to-one correspondence with the transmission holes,
wherein the regions are spaced apart from each other.

5. The display device of claim 1, further comprising:
a display module disposed below the window,
wherein the display module comprises:
the optical layer;
a plurality of conductive patterns disposed on the optical layer; and
organic and inorganic dielectric layers disposed on the optical layer,
wherein the organic and inorganic dielectric layers are optically transparent, and a refractive index of the organic and inorganic dielectric layers is the same as the refractive index of the window.

6. The display device of claim 5, wherein the display module further comprises:
a pixel layer disposed below the window,
wherein the pixel layer comprises a pixel definition layer and a light emitting element disposed in a pixel opening defined in the pixel definition layer, and
the transmission hole overlaps the pixel definition layer.

7. The display device of claim 1, wherein the optical layer further comprises:
a first lens disposed in the transmission hole.

8. The display device of claim 1, wherein the protection layer further comprises:
a lens that overlaps the transmission hole.

9. The display device of claim 1, wherein the refractive index of the protection layer is greater than a refractive index of a glass.

10. The display device of claim 1, wherein the window comprises a glass.

11. The display device of claim 5, wherein the display module is foldable about a folding axis that extends in one direction.

12. The display device of claim 11, further comprising:
a support plate disposed between the protection layer and the sensor,
wherein an opening overlapping the sensor is defined in the support plate.

13. The display device of claim 12, wherein
the support plate comprises a filler member that is optically transparent and is disposed in the opening, and
the sensor is disposed below the filler member.

14. The display device of claim 12, wherein the sensor is disposed in the opening.

15. A display device, comprising:
an upper layer having a fingerprint detection region disposed on a top surface of the upper layer,
wherein the fingerprint detection region receives a light indicating fingerprint information;
an optical layer disposed below the upper layer and having a plurality of transmission holes through which the light penetrating the upper layer passes;
a lower layer disposed below the optical layer and on which the light passing through the transmission holes is received and passes through,
wherein a refractive index of the lower layer is greater than a refractive index of the upper layer; and
a sensor disposed below the lower layer and overlapping the fingerprint detection region,
wherein the sensor receives the light passing through the lower layer,
wherein a thickness of the lower layer is greater than a thickness of the upper layer,
wherein the lower layer further comprises a plurality of first lenses that overlap the transmission holes.

16. The display device of claim 15, wherein the refractive index of the lower layer is greater than a refractive index of glass.

17. The display device of claim 15, wherein the optical layer further comprises a plurality of second lenses disposed in the transmission holes.

18. A display device, comprising:
a window on which a fingerprint detection region in which fingerprint information is detected is defined;
an optical layer disposed below the window and in which at least one transmission hole overlapping the fingerprint detection region is defined;
a protection layer disposed below the optical layer,
wherein a refractive index of the protection layer is greater than a refractive index of the window; and
a sensor disposed below the protection layer and overlapping the fingerprint detection region,
wherein a distance from the optical layer to the window is less than a distance from the optical layer to the sensor,
wherein the protection layer comprises:
a first protection layer having a first refractive index; and
a second protection layer disposed below and in direct contact with the first protection layer and having a second refractive index greater than the first refractive index,
wherein the protection layer further comprises:
a lens that overlaps the transmission hole.

* * * * *